(12) United States Patent
Xu

(10) Patent No.: US 6,812,509 B2
(45) Date of Patent: Nov. 2, 2004

(54) ORGANIC FERROELECTRIC MEMORY CELLS

(75) Inventor: Baomin Xu, Cupertino, CA (US)

(73) Assignee: Palo Alto Research Center Inc., Palo Alto, CA (US)

( * ) Notice: Subject to any disclaimer, the term of this patent is extended or adjusted under 35 U.S.C. 154(b) by 0 days.

(21) Appl. No.: 10/185,531

(22) Filed: Jun. 28, 2002

(65) Prior Publication Data

US 2004/0002176 A1 Jan. 1, 2004

(51) Int. Cl.[7] .................................................. H01G 7/06
(52) U.S. Cl. ........................ 257/295; 257/40; 257/298; 257/410
(58) Field of Search ................................ 257/295–300, 257/410–411, 40; 438/3

(56) References Cited

U.S. PATENT DOCUMENTS

| | | | | |
|---|---|---|---|---|
| 5,527,567 A | * | 6/1996 | Desu et al. ................ | 427/573 |
| 5,953,061 A | | 9/1999 | Biegelsen et al. ........... | 348/308 |
| 5,981,970 A | | 11/1999 | Dimitrakopoulos et al. .. | 257/40 |
| 6,087,688 A | | 7/2000 | Furuta et al. ............... | 257/295 |
| 6,128,211 A | | 10/2000 | Fang et al. .................. | 365/145 |
| 6,207,472 B1 | * | 3/2001 | Callegari et al. ............. | 438/99 |
| 6,225,655 B1 | | 5/2001 | Moise et al. ................ | 257/295 |
| 6,344,660 B1 | | 2/2002 | Dimitrakopoulos et al. .. | 257/40 |
| 6,344,662 B1 | * | 2/2002 | Dimitrakopoulos et al. .. | 257/40 |
| 6,498,744 B2 | * | 12/2002 | Gudesen et al. ............. | 365/145 |
| 2003/0001176 A1 | * | 1/2003 | Li et al. ..................... | 257/295 |
| 2003/0222312 A1 | * | 12/2003 | Breen et al. ................ | 257/347 |

OTHER PUBLICATIONS

Yamauchi, N., "A Metal–Insulator–Semiconductor (MIS) Device Using a Ferroelectric Polymer Thin Film in the Gate Insulator", Japanese Journal of Applied Physics, Part 1, vol. 25, No. 4, Apr. 1986, pp. 590–594.

* cited by examiner

*Primary Examiner*—H. Jey Tsai
(74) *Attorney, Agent, or Firm*—Nola Mae McBain

(57) ABSTRACT

This invention proposes to make memory using organic materials. The basic structure of the memory cell is a field effect organic transistor using a ferroelectric thin film polymer as gate dielectric. By controlling the gate voltage to polarize the thin film ferroelectric polymer polarized in either an "up" or "down" state, the source-drain current can be controlled between two different values under the same source-drain voltage. The source-drain current thus can be used to represent either a "0" or "1" state. The organic thin film transistor can be made from poly(phenylenes), thiophene oligomers, pentacene, polythiophene, perfluoro copper phthalocyanine or other organic thin films. The ferroelectric thin film can be poly(vinylidene fluoride) (PVDF), poly(vinyldiene-trifluoroethylene) (P(VDF-TrFE)) copolymers, odd-numbered nylons, cyanopolymers, polyureas, or other ferroelectric thin films. As the deposition of these organic thin films can be done at temperatures below 200° C., the memory cell can be made on many kinds of substrates including plastics.

39 Claims, 10 Drawing Sheets

ORGANIC FERROELECTRIC MEMORY CELLS

FIELD OF THE INVENTION

The present invention relates to an organic semiconductor device, more particularly to an organic field effect transistor memory cell having an organic semiconductor material forming the field effect transistor and a ferroelectric thin film polymer as gate dielectric, and methods of fabricating such a device.

BACKGROUND OF THE INVENTION

Semiconductor memories are configured as either read-only memories (ROM) such as EPROM (Electrically Programmable ROM), EEPROM (Electrically Erasable ROM), flash ROM or as volatile, random access memories (RAM) such as SRAM (Static RAM) and DRAM (Dynamic RAM). The processing required to produce these memory types are complicated and the necessary facilities are expensive due to the high temperature processing required. Ferroelectric ceramic random access memories and field effect transistor memories can be configured to be both read-write and nonvolatile, but again the processing conditions require processing at temperatures in excess of about 600° C. Furthermore, these silicon-based or ferroelectric ceramic-based memories are expensive as the inorganic raw materials used are expensive when compared to many organic materials in addition to the high costs involved in the processing.

Ferroelectric materials possess the unique properties of a spontaneous polarization which can be re-oriented with an applied field, and that the polarization state can be retained even after the removal of electric field. Hence ferroelectric materials can contain two data states ("+" and "−" polarization states) which are very stable over a variety of environmental conditions. These properties allow ferroelectric materials to be one of the best materials for production of digital computer memories. Research activities on ferroelectric-based computer memories commenced in the 1950s, just following the appearance of computers. However, because these early researches focused on using bulk ferroelectric materials which required very high applied voltages to be used to re-orient the polarization, the research activities were discontinued and no commercial products developed.

In the 1980s, with the advances of ferroelectric thin film deposition technology and integration of ferroelectric thin films with silicon microelectronics, practical ferroelectric memories were developed and commercial products were introduced in the market. These advances allowed for the manufacture of ferroelectric thin film based memories which use a standard 5V or 3V voltage to re-orient the polarization or that is, to read and write data. These ferroelectric random access memories (FRAM) combine the advantages of read-on memories (ROM) and volatile random access memories. FRAM have the same advantages of DRAM and SRAM in that they are easy to write, but are superior to DRAM and SRAM due to their nonvolatility. That is, FRAM store the data even in the absence of power. FRAM also have the same advantages of EPROM, EEPROM and Flash ROM in that they are easy to read, but are superior to EPROM and EEPROM as the write speed of FRAM is much faster than that of EPROM, EEPROM and Flash ROM as well as having a higher number of allowed write cycles. However, FRAM does have one drawback. This major drawback is the destructive readout. In order to determine if the polarization of the ferroelectric thin film cell is positive (e.g., representing a "0") or negative (e.g., representing a "1"), a positive (or a negative) pulse is applied to the cell. The induced charge will be significantly different between positively and negatively polarized ferroelectric cells. However, if the original state of the ferroelectric cell was a negative polarization state, it will change to positive polarization state after reading via a positive pulse being applied to the cell. Likewise, if the original state of the ferroelectric cell was a positive polarization state, it will change to negative polarization state after reading via a negative pulse being applied to the cell. This destructive readout requires that each read access be accompanied by a pre-charge operation to restore the memory state.

In order to solve the destructive readout problem, ferroelectric thin film-based field effect transistors (FETs) have been proposed as the next-generation ferroelectric memories. The ferroelectric FETs use a ferroelectric thin film as a gate dielectric. The ferroelectric thin film is deposited on a silicon substrate, either with or without a thin dielectric layer such as silicon dioxide ($SiO_2$) or silicon nitride ($Si_3N_4$) between the silicon substrate and the ferroelectric thin film. When a gate voltage is applied, the polarization of the ferroelectric thin film can be either positive or negative and the polarization state can be retained after the removal of gate voltage. This positive or negative polarization can affect the source-drain current or the source-drain resistance. As the source-drain current or resistance can be controlled by the polarization state of the ferroelectric thin film, a single ferroelectric FET can be used as a memory cell. It can be seen that the ferroelectric FET memory cells have all the advantages of FRAM, such as nonvolatility, easy to read and write, lower power consumption, plus the additional advantage of a nondestructive readout. Furthermore, FRAMs utilizing ferroelectric thin films have a larger remnant polarization (usually larger than 10 $\mu C/cm^2$), while a remnant polarization of at the order of one-tenth $\mu C/cm^2$ can effectively change the source-drain current in ferroelectric FET memories.

It should be noted that all current ferroelectric FET memory cells use ferroelectric ceramic thin films such as lead zirconate titanate (PZT) or strontium bismuth tantalate (SrBi2Ta2O9 or SBT) with Si-based semiconductors. Therefore, both to deposit the ferroelectric film and to make the FET requires high temperature processes with temperatures in excess of about 600° C. More recently, a research group in France has demonstrated (G. Velu, C. Legrand, O. Tharaud, A. Chapoton, D. Remiens, and G. Horowitz, Appl. Phys. Lett, 79, 659, 2001) the memory effect of a ferroelectric FET using PZT thin film as gate dielectric and α6T (sexithiophene) organic thin film transistor. The deposition of α6T organic thin film can be done at 100° C., but the preparation of PZT film needs a post annealing treatment at 625° C.

In contrast to ferroelectric ceramic thin films, ferroelectric polymer thin films, such as in the family of poly(vinyidiene-trifluoroethylene) (P(VDF-TrFE)) copolymers can be easily deposited on silicon or other substrates using solution spin coating, casting, evaporation or Langmuir-Blodgett (LB) growth method, with the growth temperature lower than 200° C. The remnant polarization of these polymer thin films can be higher than 40 $mC/m^2$, or 4 $\mu C/cm^2$, which is large enough to change the source-drain current and suitable for use in a ferroelectric memory device. Thus organic, nonvolatile, nondestructive readout ferroelectric memory cells can be developed by combining ferroelectric polymer thin film technology and organic thin film transistor technology.

SUMMARY OF THE INVENTION

There is provided a FET memory cell that comprises a substrate which could be made from a wide variety of materials such as silicon, metal, glass, or plastic, a polymer ferroelectric thin film gate dielectric such as P(VDF-TrFE) copolymer thin film, an organic thin film semiconductor such as a pentacene film, and gate, source, and drain electrodes which could be constructed using a variety of conducting materials such as a thin metal film, conducting oxide, or conducting polymer. The memory cell may also contain a dielectric polymer layer between the ferroelectric polymer thin film and the organic semiconductor thin film and a floating gate electrode.

There are many candidate ferroelectric polymer materials that can be used in the above memory structures, including but not limited to poly(vinylidene fluoride) (PVDF), poly (vinyidiene-trifluoroethylene) (P(VDF-TrFE)) copolymers, odd-numbered nylons, cyanopolymers, polyureas and polythioureas. Thin films of these polymers can be produced by solution spin coating or solution casting, Langmuir-Blodgett (LB) monolayer growth method, and vapor deposition polymerization process. Typically these deposition processes can be done below 200° C. A typical process to produce P(VDF-TrFE) copolymer thin films by solution spin coating method has been described in Q. M. Zhang, H. Xu, F. Fang, Z. Y. Cheng, F. Xia, and H. You, J. Appl. Phys., 89, 2613, 2001. The steps in this typical process include first dissolving P(VDF-TrFE) copolymers in the composition range from 50/50 to 80/20 mol % in dimethylformide (DMF), with a resulting concentration ranging from 4 wet % to 12 wet %. Then the solution is used in a spin coating process to provide a film. It is well known in the art that films with various thicknesses can be obtained by controlling the spin conditions and/or using a process which uses multiple coating procedure. Finally the films are annealed at 140° C. under vacuum to remove the residual solvent and to improve the crystallization. This process can obtain films with a thickness between 120 nm to more than 1 $\mu$m and remnant polarization of more than 40 mC/m$^2$. An alternative process uses the Langmuir-Blodgett deposition method to obtain P(VDF-TrFE) 70/30 copolymer films, with thickness of 5000 Å to 5 Å.

There are organic semiconductor thin film materials that can be used in the memory cells in this invention, include but are not restricted to poly(phenylenes), thiophene oligomers, pentacene, polythiophene, and perfluoro copper phthalocyanine. While a wide variety of organic semiconductor thin films materials are suitable, it is believed that those materials with high mobility or high current modulation $I_{on}/I_{off}$ are preferred as the source-drain current of such materials is more sensitive to an applied gate voltage. It is believed that the higher sensitivity to an applied gate voltage will result in improved read/write characteristics. Examples of these materials include pentacene, and $\alpha$-$\omega$-dihexylhexathiophene (DH6T). The thickness of the organic semiconductor thin films can be in the range of approximately 5 nm to approximately 5 $\mu$m, with a preferred range of approximately 50 nm to approximately 200 nm and more preferably a thickness of approximately 100 nm.

These organic thin film semiconductors can be made by well known processes such as vacuum evaporation, electrochemical polymerization, solution spin coating, screen printing, ink jet printing, and Langmuir-Blodgett growth. For example, pentacene thin films can be produced by using vapor deposition with the substrate temperatures from room temperature to 120° C. as described in C. D. Dimitrakopoulos, B. K. Furman, T. Graham, S. Hegde, and S. Purushothaman, Synth. Met., 92, 47, 1998, or by solution spin coating method using dichloromethane as solvent and annealing temperatures of 140 to 180° C. as described in A. R. Brown, A. Pomp, D. M. de Leeuw, D. B. M. Klaassen, E. E. Havinga, P. Herwig, and K. Mullen, J. Appl. Phys., 79, 2136, 1996.

Silicon wafers and silicon oxide grown on silicon wafers have been widely used as substrates and gate dielectric to make organic thin film FETs. Organic thin film FETs have also been built on glass substrates and plastic polyster substrates, and using organic polyimide, polyvinyl alcohol (PVA), polyvinyl chloride (PVC), and polymethylmethacrylate (PMMA) as gate dielectric as described in X. Peng, G. Horowitz, D. Fichiou, and F. Garnier, Appl. Phys. Lett., 57, 2013, 1990; Z. Bao, Y. Fang, A. Dodabalapur, V. R. Raju, and A. J. Lovinger, Chem. Mater., 9, 1299, 1997. Evaporated or sputtered metal electrodes such as gold, platinum, or aluminum, evaporated or printed conducting oxides such as Indium-Tin oxide (ITO) and conducting polymers such as polyaniline have been used as electrodes for organic thin film FETs as described in Z. Bao, Y. Fang, A. Dodabalapur, V. R. Raju, and A. J. Lovinger, Chem. Mater., 9, 1299, 1997; G. Gustagsson, Y. Cao, G. M. Treacy, F. Klavetter, N. Colaneri, and A. J. Heeger, Nature, 357, 277, 1992. It has also been reported that conducting polymer electrodes can improve the performance of ferroelectric P(VDF-TrFE) thin films by Z. Y. Cheng, H. S. Xu, J. Su, Q. M. Zhang, P. C. Wang, and A. G. MacDiarmid, Proc. SPIE, 3669, 140, 1999.

A typical sequence used in the fabrication of the proposed memory cells includes the following general steps which will be discussed in more detail below:

1). Selection of substrates and preparation of the gate electrode. The substrate could be any of, but not limited to, silicon, metal, glass and plastic or any other material that can withstand the temperatures of approximately 200° C. used during some of the subsequent processing steps. The substrate may be either rigid or flexible, as the organic thin film semiconductors and ferroelectric polymer thin films can be flexed.

The gate electrode could be any patterned conductive material such as a metal thin film, for instance gold, platinum, aluminum, or titanium, a conducting oxide such as ITO, or a conducting polymer such as polyaniline, and polypyrrol on the surface of the substrate.

If a conducting material is used for the substrate, such as doped silicon substrates or metal substrates, then the substrate should include a thin insulating layer on the upper surface in order to isolate the gate electrodes from the substrate. For instance a silicon wafer could have a thin layer of oxidization or nitride on the upper surface as an insulator. For a metal substrate, a thin inorganic insulating layer, such silicon oxide or silicon nitride, or a thin organic insulating layer, such as polyimide, may be used. Such thin organic insulating layers may be deposited on the surface by using well known sputtering, chemical vapor deposition, or solution deposition method. The insulating layers described above are for descriptive use only, and other insulating layers may also be used.

The gate electrode could be deposited by the well known methods of evaporation, sputtering, screen or jet printing, solution dip or spin coating depending on which process is most suitable for the electrode, material and substrate being used.

2). Deposition of ferroelectric polymer thin films to form the gate dielectrics. While ferroelectric polymer materials in the family of P(VDF-TrFE) copolymers are suitable, other ferroelectric polymer materials such as PVDF, odd-numbered nylons, cyanopolymers, polyureas and polythioureas could also be used. These polymer thin films could be deposited by evaporation, solution casting or spin coating, Langmuir-Blodgett growth method, screen printing or jet printing.

3). Deposition of organic semiconductor thin films on top of the ferroelectric polymer thin films. The organic semiconductor materials can be, but not limited to, poly (phenylenes), thiophene oligomers, pentacene, polythiophene, and perfluoro copper phthalocyanine. These organic semiconductor thin films used can be deposited by vapor deposition, solution casting or spin coating, screen printing or jet printing, Langmuir-Blodgett growth method or self assembly of layers from solution or other methods.

4). Fabrication of source and drain electrodes on the top surface of the organic semiconductor thin films. The materials and processes are similar to the deposition of gate electrodes discussed hereinabove.

While the basic steps have been described above there are several optional steps that may also be used. These optional steps are described below.

One optional step is to deposit a thin polymer dielectric layer between the ferroelectric polymer thin film and organic semiconductor thin film. This thin polymer dielectric layer could be polyimide, PVA, PVC, PMMA, and PVDF and P(VDF-TrFE) in paraelectric state. This thin polymer dielectric layer can be deposited by, but not restricted to evaporation, solution casting or spin coating, and screen printing or jet printing.

Another optional step is to deposit a thin conducting layer between the ferroelectric polymer thin film and the thin polymer dielectric layer. The choice of materials and the deposition there of is similar to the deposition of gate electrodes discussed hereinabove.

Another optional step is to apply a passivation coating as the last step to protect the memory cell by chemical or physical vapor deposition, sputtering, solution spin or dip coating and curing.

The sequences of the steps to deposit gate electrode, ferroelectric polymer thin film, organic semiconductor thin film, and source and drain electrodes could be altered or revised to make various alternative structures of the memory cells and to allow process compatibility and ease of fabrication. The variation of electrode materials, ferroelectric polymer thin film materials, organic semiconductor thin film materials, polymer thin dielectric materials, and the variation of the sequences of the steps to deposit these materials are included within the spirit and scope of this invention.

While the present invention will be described in connection with a specific embodiments and/or methods of use, it will be understood that it is not intended to limit the invention to those embodiments and procedures. On the contrary, it is intended to cover all alternatives, modifications and equivalents as may be included within the spirit and scope of the invention as defined by the appended claims.

DETAILED DESCRIPTION OF THE PREFERRED EMBODIMENTS

Figure 1:
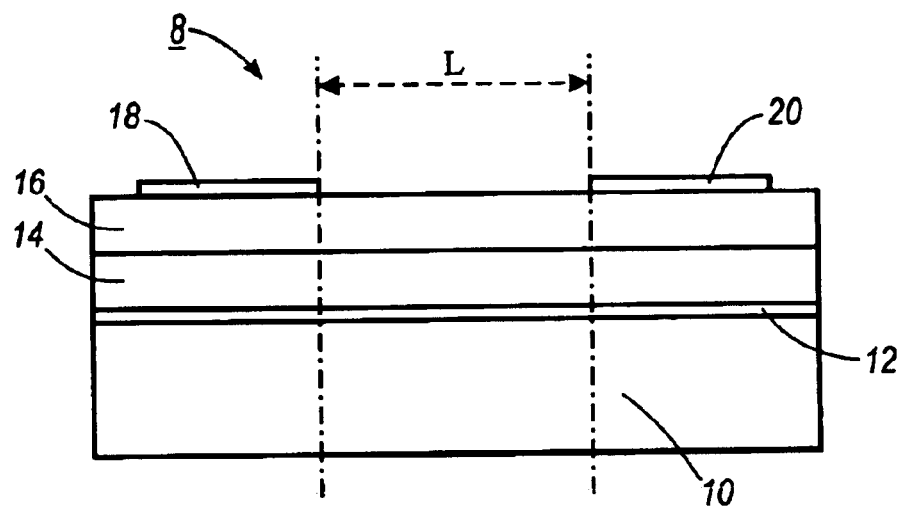
FIG. 1 is a cross section showing a first embodiment of the present invention.

Turning now to FIG. 1 a cross-sectional view of a first embodiment of a ferroelectric FET which uses organic or polymer materials and is constructed as a nonvolatile, nondestructive readout memory cell 8 is shown. Memory cell 8 uses an organic thin film FET utilizing a ferroelectric polymer thin film as a gate dielectric. As all of the individual processing steps are well known in the art, the following description will proceed by focussing on the structure and materials choices for the memory cell and variations in these.

The memory cell 8 is constructed on a substrate 10, which can be either a rigid or flexible substrate. The substrate 10 can be comprised of a variety of materials which have a substantially smooth surface and can withstand temperatures up to 200° C. such as including silicon, metal, glass and many types of plastic. If the substrate is a semiconductor, such as silicon, or conductive, such as metal, it should have a thin insulating layer on an upper surface of the substrate. This thin insulating layer could be inorganic material such as silicon oxide, silicon nitride, or organic material such as polyimide. The gate electrode 12 is on the upper surface of the substrate 10. The thin insulating layer is used to isolate the gate electrode 12 from the semiconducting or conducting substrate and can be deposited by thermally grown, sputtering, chemical vapor deposition, solution deposition, and printing.

The gate electrode 12 can be made from a variety of conducting materials such as gold, platinum, aluminum, titanium, conducting oxides such as ITO, or conducting polymers such as polyaniline, and polypyrrol or any other conducting material. On the upper surface of the gate electrode 12 is a layer of ferroelectric polymer thin film 14 such as P(VDF-TrFE) or other ferroelectric polymer thin film which can demonstrate a clear polarization-electric field hysteresis loop. The thickness of the film could be in the range from approximately 5 nm to approximately 5 µm, with the preferred range of approximately 50 nm to approximately 200 nm and more preferably a thickness of approximately 100 nm. The remnant polarization of the ferroelectric polymer thin film should be at least larger than 0.1 $\mu C/cm^2$, with a preferred value of at least 0.5 $\mu C/cm^2$. While a wide range of remnant polarization values will enable the memory cell, larger values are preferred as it is believed the larger values will enable favorable read/write characteristics of the memory cell.

On top of the ferroelectric polymer thin film 14 is a layer of organic semiconductor 16 which can be any organic semiconductor, including but not limited to poly (phenylenes), thiophene oligomers, pentacene, polythiophene, and perfluoro copper phthalocyanine or other organic semiconductors. The thickness of the semiconductor film could be in the range from approximately 5 nm to approximately 5 µm, with a preferred range of approximately 50 nm to approximately 200 nm and more preferably a thickness of approximately 100 nm. While any semiconductor organic thin film materials can be used, materials with higher mobility and high current modulation $I_{on}/I_{off}$ may provide preferable read/write characteristics. For instance, it is believed a field-effect mobility of at least $10^{-5}$ $cm^2V^{-1}S^{-1}$ will provide clear read/write characteristics, and a field-effect mobility of at least $10^{-3}$ $cm^2V^{-1}S^{-1}$ will provide additional improved read/write characteristics.

In the embodiment shown in FIG. 1, the source and drain electrodes 18, 20 are on the top surface of the organic semiconductor 16 with a space therebetween. The width of the space between the source electrode 18 and the drain electrode 20 shall be defined as the channel length L and the portion of the organic semiconductor therebetween is defined as a channel region.

The source and drain electrodes can be made from a variety of conducting materials such as metal thin films such as gold, platinum, aluminum, titanium, conducting oxides such as ITO, or conducting polymers such as polyaniline, and polypyrrol or other conducting materials.

Figure 2:
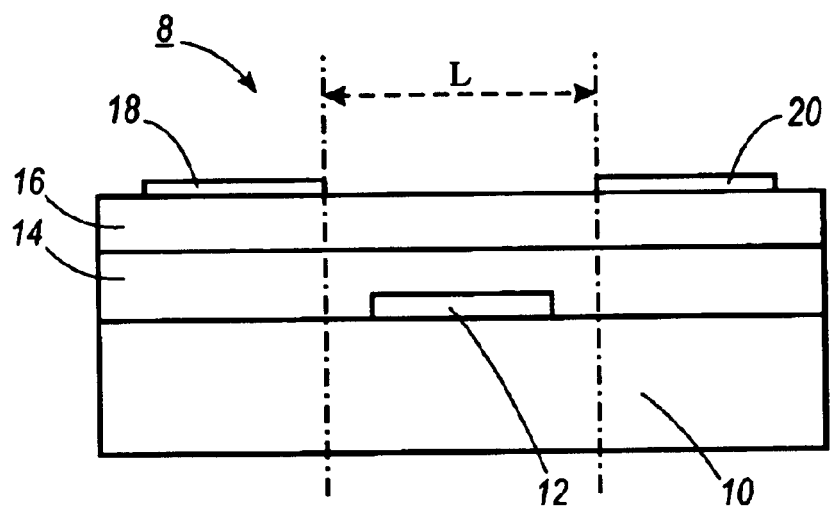
FIG. 2 is a cross section showing a second embodiment of the present invention.
Figure 3:
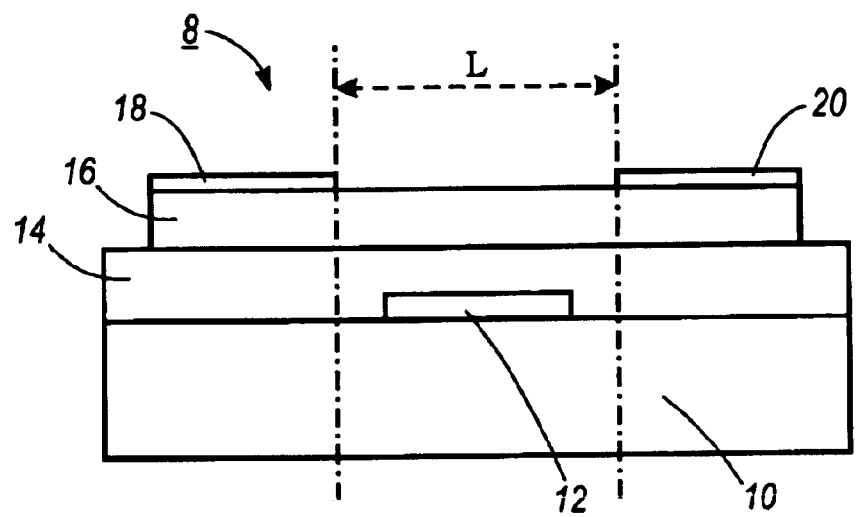
FIG. 3 is a cross section showing a third embodiment of the present invention.

FIGS. 2 and 3 show variations in the construction of the gate electrode 12 and the organic semiconductor thin film 16 with respect to the embodiment shown in FIG. 1. Therefore, the same reference numerals will be used to reference the same elements and the discussion will focus on the variations from FIG. 1. While these variations are discussed with reference to the embodiment shown in FIG. 1, it should be noted that these variations are also applicable to the embodiments shown in the following figures as well.

FIG. 2 illustrates that the gate electrode 12 need only span a portion of the channel length L for the memory cell to be operative. FIG. 3 illustrates that the semiconductor thin film 16 need only span both the source electrode 18 and the drain electrode 20.

Figure 4:
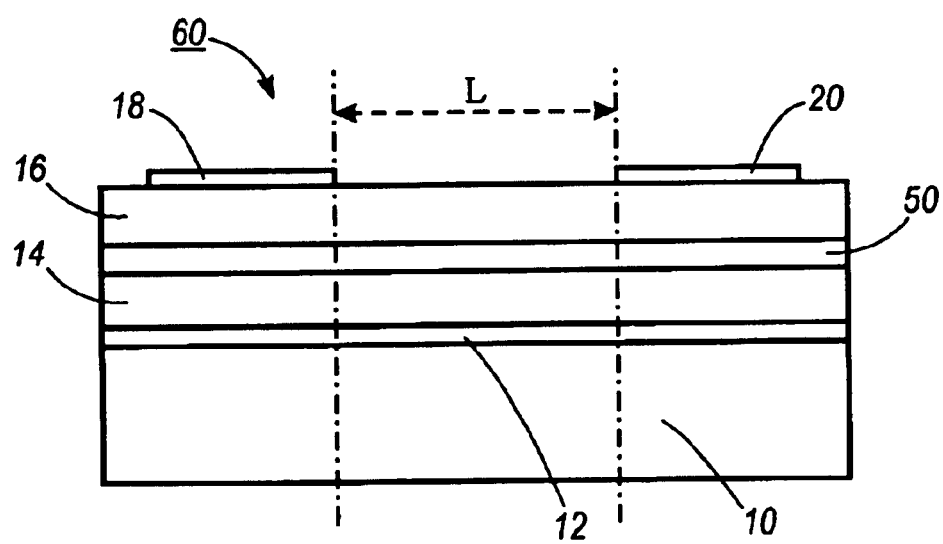
FIG. 4 is a cross section showing a fourth embodiment of the present invention.

FIG. 4 shows a fourth embodiment of a memory cell 60 similar to the first embodiment shown in FIG. 1 therefore the same reference numerals will be used to reference similar elements. As in the first embodiment, the memory cell 60 is constructed on a substrate 10 which can be comprised of a variety of any material which has a substantially smooth surface and can withstand temperatures up to 200° C. such as including silicon, metal, glass and many types of plastic. The gate electrode 12 is on an upper surface of the substrate 10 and can be made from a variety of conducting materials such as gold, platinum, aluminum, titanium, conducting oxides such as ITO, or conducting polymers such as polyaniline, and polypyrrol or any other conducting material. On the upper surface of the gate electrode 12 is a layer of ferroelectric polymer thin film 14 such as P(VDF-TrFE) or other ferroelectric polymer thin film which can demonstrate a clear polarization-electric field hysteresis loop. On top of the ferroelectric polymer thin film 14, and interposed between the polymer thin film 14 and the organic semiconductor 16, is a thin organic dielectric layer 50 which is used to improve the interface between the ferroelectric polymer thin film 14 and the organic semiconductor 16 and to block the injection current between the ferroelectric polymer thin film 14 and the organic semiconductor 16. This thin dielectric layer 50 can be made from a variety of dielectrics including but not limited to cyanoethylpullulan (CYEPL), polyimide, polyvinyl alcohol (PVA), polyvinyl chloride (PVC), polymethyylmeththacrylate (PMMA), polystyrene (PSt), and the paraelectric phase (α-phase) PVDF. While a variety of dielectrics can be used to construct the memory cell 60, it is believed that dielectrics with a dielectric which is approximately the same as the dielectric constant of the ferroelectric polymer film 14 or larger than that of the ferroelectric polymer thin film 14 will result in a memory cell 60 which can use smaller applied voltages to write to the memory cell 60.

For example, if a P(VDF-TrFE) ferroelectric polymer is used for the ferroelectric thin film polymer thin film 14, which has a dielectric constant of about 8, it will be preferable to use CYEPL (dielectric constant of about 18), α-phase PVDF (dielectric constant of about 12), PVA (dielectric constant of about 8) to make the organic dielectric layer 50. While using a dielectric such as PSt which has a dielectric constant of about 2.5 is also possible, the memory cell 60 may have some less desirable performance characteristics.

High dielectric constant materials for the organic dielectric layer 50 may be preferred for the following reason. In operation of the memory cell 60, the organic dielectric layer 50 and the ferroelectric polymer thin film 14 can be viewed as two capacitors which are connected in series. When a gate voltage is applied to re-orient the polarization of the ferroelectric polymer thin film, this voltage will be divided into the voltage applied on the ferroelectric polymer thin film 14 and the voltage applied on the organic dielectric layer 50. However, only the voltage applied on the ferroelectric polymer thin film 14 is effective to re-orient the polarization of the ferroelectric polymer thin film 14. The higher dielectric constant of the organic dielectric layer 50, results in a larger capacitance of the organic dielectric layer 50, and a smaller impedance of the organic dielectric layer 50, and therefore more part of the gate voltage will be applied to the ferroelectric polymer thin film 14. Utilizing more of the gate voltage to the ferroelectric polymer thing film 14 results in a reduced gate voltage requirement to operate the memory cell 60.

Alternatively, when a smaller dielectric constant material is used for the organic dielectric layer 50, the thickness of this organic dielectric layer 50 may be reduced in order to increase the capacitance and thus achieve similar effects. Nevertheless, it should be noted that materials with a smaller dielectric constant may be used for the organic dielectric layer 50, however, this may result in less desirable operating parameters for some applications.

A layer of organic semiconductor 16 is on the top surface of the organic dielectric layer 50. As before, the organic semiconductor can be any organic semiconductor including poly(phenylenes), thiophene oligomers, pentacene, polythiophene, and perfluoro copper phthalocyanine or other organic semiconductors, but the materials with higher mobility or higher current modulation $I_{on}/I_{off}$ may be preferred as discussed above. The source and drain electrodes 18, 20 are on the top surface of the organic semiconductor 16. As discussed earlier, the source and drain electrodes 18, 20 can be made from a variety of conducting materials such as metal thin films such as gold, platinum, aluminum, titanium, conducting oxides such as ITO, or conducting polymers such as polyaniline, and polypyrrol or other conducting materials.

Figure 5:
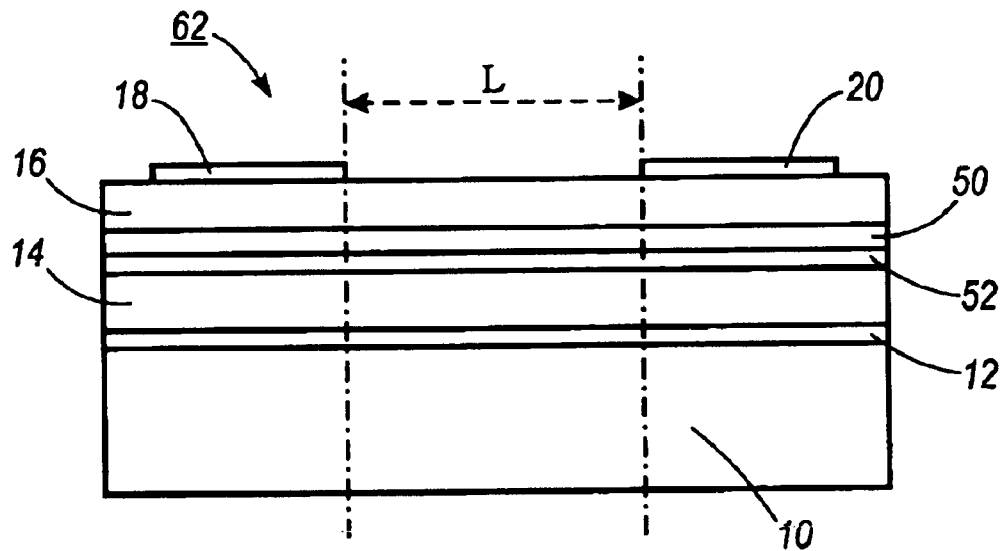
FIG. 5 is a cross section showing a fifth embodiment of the present invention.

FIG. 5 shows a fifth embodiment of a memory cell 62 similar to the fourth embodiment shown in FIG. 4, therefore the same reference numerals will be used to reference similar elements. As in the previous embodiments, the memory cell 62 is constructed on a substrate 10 which can be comprised of a variety of any material which has a substantially smooth surface and can withstand temperatures up to 200° C. such as including silicon, metal, glass and many types of plastic. The gate electrode 12 is on an upper surface of the substrate 10 and can be made from a variety of conducting materials such as gold, platinum, aluminum, titanium, conducting oxides such as ITO, or conducting polymers such as polyaniline, and polypyrrol or any other conducting material. On the upper surface of the gate electrode 12 is a layer of ferroelectric polymer thin film 14 such as P(VDF-TrFE) or other ferroelectric polymer thin film which can demonstrate a clear polarization-electric field hysteresis loop. On top of the ferroelectric polymer thin film 14 is a floating gate electrode 52 which is used to improve the performance of the memory cell. This floating gate electrode 52 can be made of a variety of conductive materials such as metals, such as gold, platinum, aluminum, titanium, conducting oxides such as ITO, or conducting polymers such as polyaniline, and polypyrrol. On the top surface of the floating gate electrode 52 is a thin dielectric layer 50 which can be made from a variety of dielectrics including but not limited to CYEPL, polyimide, PVA, PVC, PMMA, PSt, and the paraelectric phase (α-phase) PVDF as has been discussed above. A layer of organic semiconductor 16 is on the top surface of the organic dielectric layer 50. As before, the organic semiconductor can be any organic semiconductor including but not limited to poly(phenylenes), thiophene oligomers, pentacene, polythiophene, and perfluoro copper phthalocyanine or other organic semiconductors as discussed above. The source and drain electrodes 18, 20 are on the top surface of the organic semiconductor 16. As discussed earlier, the source and drain electrodes 18, 20 can be made from a variety of conducting materials such as metal thin films such as gold, platinum, aluminum, titanium, conducting oxides such as ITO, or conducting polymers such as polyaniline, and polypyrrol or other conducting materials.

Figure 6:
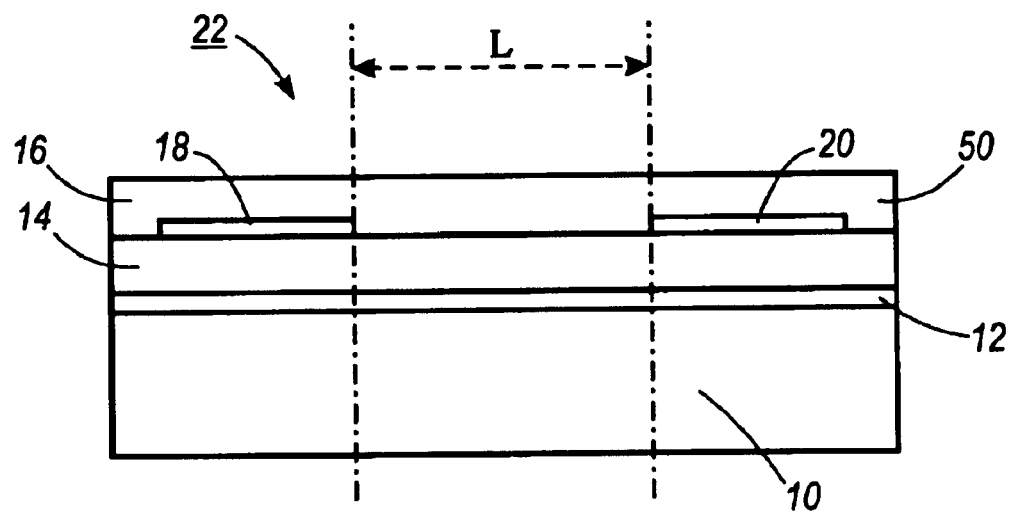
FIG. 6 is a cross section showing a sixth embodiment of the present invention.

FIG. 6 shows a sixth embodiment of a memory cell 22 similar to the first embodiment shown in FIG. 1 therefore the same reference numerals will be used to reference similar elements. The memory cell 22 is again constructed on a substrate 10 that can be comprised of a variety of materials such as including silicon, metal, glass and plastic as discussed above. Also, as shown in the embodiment in FIG. 1, the gate electrode 12 is constructed on the surface of the substrate 10 and can be constructed from a variety of conducting materials as discussed. On the surface of the gate electrode 12 is again a layer of ferroelectric polymer thin film 14 such as P(VDF-TrFE). In this embodiment however, the source and drain electrodes 18, 20 are on the top surface of the ferroelectric polymer thin film 14. Again, the source and drain electrodes can be made from a variety of conducting materials as discussed above. On top of exposed portions of the ferroelectric polymer thin film 14 and the source and drain electrodes 18, 20 is a layer of organic semiconductor 16 such as poly(phenylenes), thiophene oligomers, pentacene, polythiophene, perfluoro copper phthalocyanine, or other organic semiconductor as discussed above.

Figure 7:
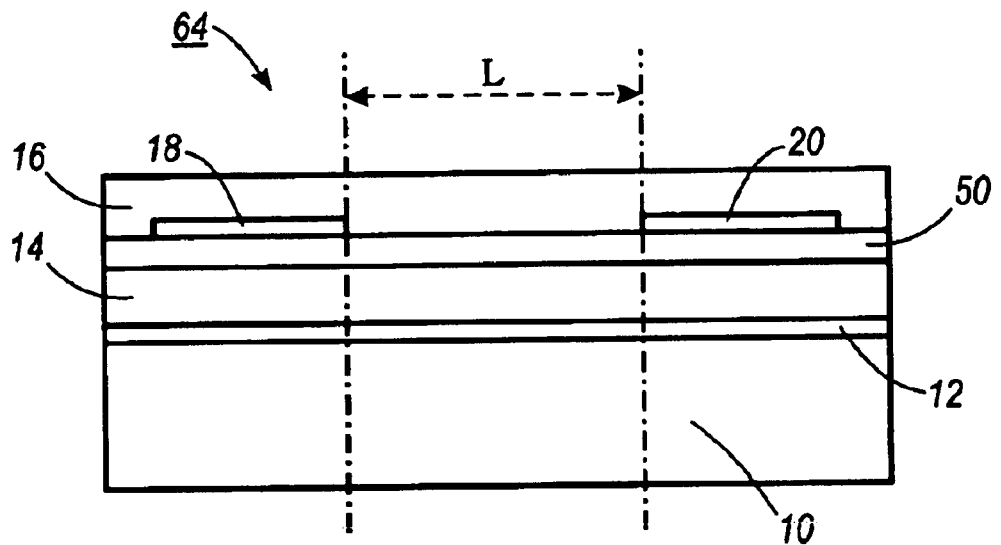
FIG. 7 is a cross section showing a seventh embodiment of the present invention.

FIG. 7 shows a seventh embodiment of a memory cell 64 similar to the above described embodiments, therefore the same reference numerals will be used to reference the same features. The memory cell 64 is again constructed on a substrate 10 that can be comprised of a variety of materials such as including silicon, metal, glass and plastic as discussed above. Also, as shown in the earlier embodiments, the gate electrode 12 is constructed on the surface of the substrate 10 and can be constructed from a variety of conducting materials as discussed. On the surface of the gate electrode 12 is again a layer of ferroelectric polymer thin film 14 such as P(VDF-TrFE). In this embodiment a thin dielectric layer 50 is on the top surface of the ferroelectric polymer thin film 14. This thin dielectric layer 50 can be made from a variety of dielectrics such as polyimide, PVA, PVC, and PMMA as discussed above. The source and drain electrodes 18, 20 are on the top surface of the dielectric layer 50. Again, the source and drain electrodes can be made from a variety of conducting materials as discussed above. On top of exposed portions of the dielectric layer 50 and the source and drain electrodes 18, 20 is a layer of organic semiconductor 16 such as poly(phenylenes), thiophene oligomers, pentacene, polythiophene, perfluoro copper phthalocyanine, or other organic semiconductor as discussed above.

Figure 8:
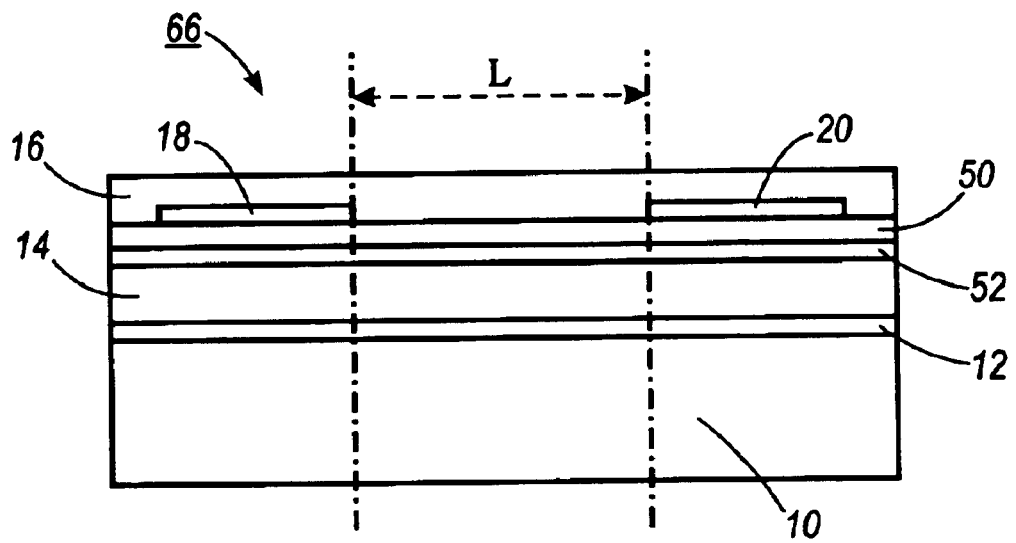
FIG. 8 is a cross section showing an eighth embodiment of the present invention.

FIG. 8 shows a eighth embodiment of a memory cell 66 similar to the forgoing embodiments, therefore the same reference numerals will be used to reference the similar elements. The memory cell 66 is again constructed on a substrate 10 that can be comprised of a variety of materials such as including silicon, metal, glass and plastic as discussed above. Also, as shown in the earlier embodiments, the gate electrode 12 is constructed on the surface of the substrate 10 and can be constructed from a variety of conducting materials as discussed. On the surface of the gate electrode 12 is again a layer of ferroelectric polymer thin film 14 such as P(VDF-TrFE). In this embodiment a floating gate electrode 52 is on the top surface of the ferroelectric thin film 14. This floating gate electrode 52 can be a variety of conducting materials as discussed above. A thin dielectric layer 50 is on the top surface of the floating gate electrode. This thin dielectric layer 50 can be made from a variety of dielectrics such as polyimide, PVA, PVC, and PMMA as discussed above. The source and drain electrodes 18, 20 are on the top surface of the dielectric layer 50. Again, the source and drain electrodes can be made from a variety of conducting materials as discussed above. On top of exposed portions of the dielectric layer 50 and the source and drain electrodes 18, 20 is a layer of organic semiconductor 16 such as poly(phenylenes), thiophene oligomers, pentacene, polythiophene, perfluoro copper phthalocyanine, or other organic semiconductor as discussed above.

Figure 9:
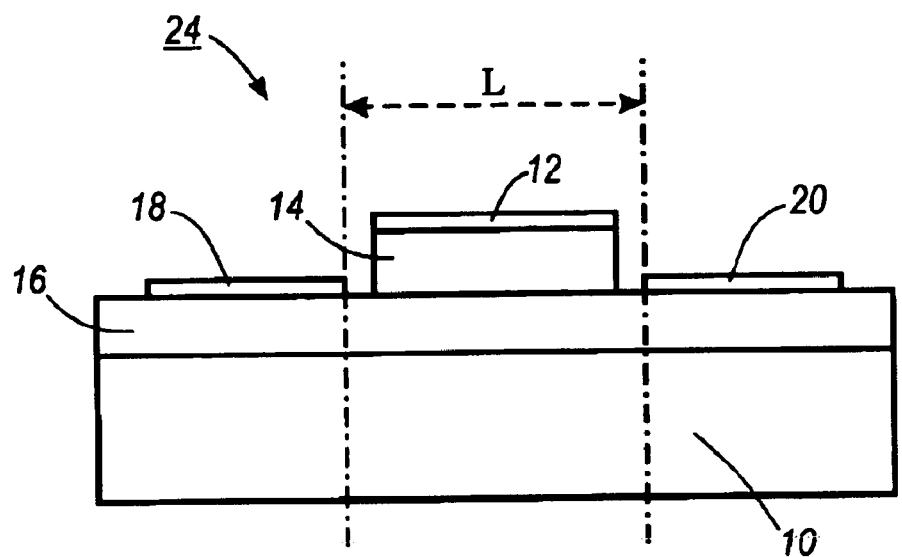
FIG. 9 is a cross section showing a ninth embodiment of the present invention.

FIG. 9 shows a ninth embodiment of a memory cell 24 similar the forgoing embodiments. Therefore the same reference numerals will be used to reference similar elements. One difference between the embodiments shown in FIGS. 9, 10, and 11 from the embodiments shown in FIGS. 1 through 8 is that there will be no electrodes directly deposited on the substrates. Therefore for these memory cells if a semiconducting or conducting substrate is used, it is not necessary to have a thin insulating layer on the upper surface of the substrate. However, a thin insulating layer on the upper surface of the substrate may improve the performance of the device, and therefore a thin insulating layer on the surface of the substrate is optional and may be provided if desired.

The memory cell 24 is again constructed on a substrate 10 which can be comprised of a variety of materials such as including silicon, metal, glass and plastic as discussed above. However, in this embodiment on the surface of the substrate 10 is a layer of organic semiconductor 16 such as poly(phenylenes), thiophene oligomers, pentacene, polythiophene, and perfluoro copper phthalocyanine as discussed above. A protruding structure of ferroelectric polymer thin film 14 such as P(VDF-TrFE) and the source and drain electrodes 18, 20 are then constructed on the organic semiconductor 16 layer. The thickness of the protruding ferroelectric polymer thin film can be in the range of approximately 5 nm to approximately 5 $\mu$m, preferably in the range of approximately 50 nm to approximately 200 nm and more preferably with a thickness of approximately 100 nm. Again, the source and drain electrodes can be made from a variety of conducting materials as discussed above. The gate electrode 12 is constructed on the surface of the protruding ferroelectric polymer film layer 14. The gate electrode 12 may be constructed of a variety of conducting materials as discussed above.

Figure 10:
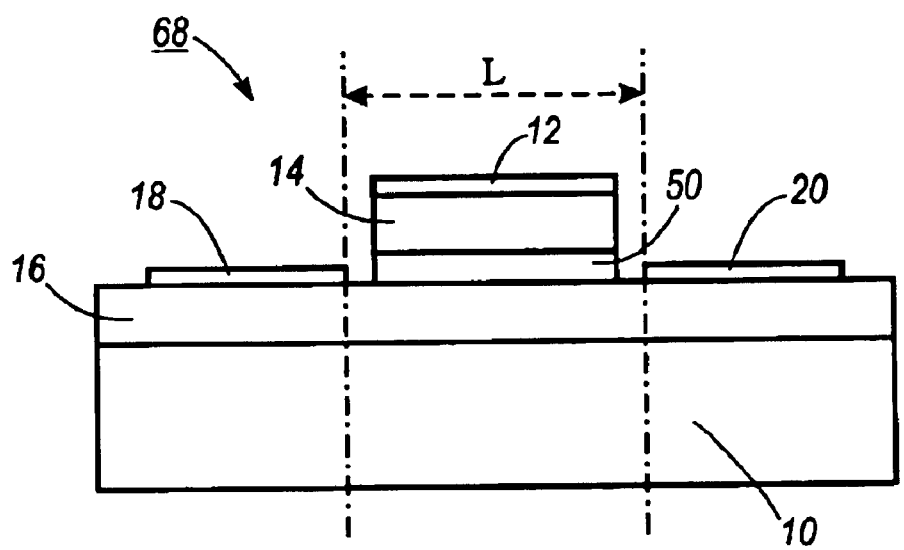
FIG. 10 is a cross section showing a tenth embodiment of the present invention.

FIG. 10 shows an tenth embodiment of a memory cell 68 similar to the forgoing embodiments, therefore the same reference numerals will be used to reference similar elements. The memory cell 68 is again constructed on a substrate 10 which can be comprised of a variety of materials such as including silicon, metal, glass and plastic as discussed above. On the surface of the substrate 10 is a layer of organic semiconductor 16 such as poly(phenylenes), thiophene oligomers, pentacene, polythiophene, and perfluoro copper phthalocyanine as discussed above. A thin dielectric layer 50 is on the surface of the organic semiconductor thin film 16 as well as the source and drain electrodes 18, 20. The thin dielectric layer 50 can be made from a variety of materials including polyimide, PVA, PVC, or PMMA as discussed above. Again the thickness of the protruding ferroelectric polymer thin film 14 can be in the range of 5 nm to 5 $\mu$m as discussed above. Also the source and drain electrodes can be made from a variety of conducting materials as discussed above. A protruding structure of ferroelectric polymer thin film 14 such as P(VDF-TrFE) is constructed on the thin dielectric layer 50. The gate electrode 12 is constructed on the surface of the protruding ferroelectric polymer film layer 14. The gate electrode 12 may be constructed of a variety of conducting materials as discussed above.

Figure 11:
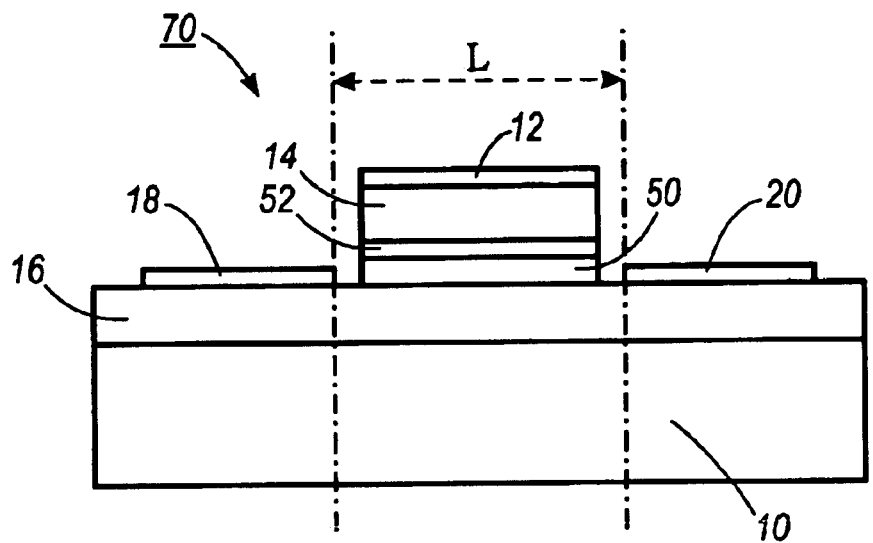
FIG. 11 is a cross section showing an eleventh embodiment of the present invention.

FIG. 11 shows a eleventh embodiment of a memory cell 70 similar to the foregoing embodiments and therefore the same reference numerals will be used to reference similar elements. The memory cell 70 is again constructed on a substrate 10 which can be comprised of a variety of materials such as including silicon, metal, glass and plastic as discussed above. On the surface of the substrate 10 is a layer of organic semiconductor 16 such as poly(phenylenes), thiophene oligomers, pentacene, polythiophene, and perfluoro copper phthalocyanine as discussed above. A thin dielectric layer 50 is on the surface of the organic semiconductor thin film 16 as well as the source and drain electrodes 18, 20. The thin dielectric layer 50 can be made from a variety of materials including polyimide, PVA, PVC, or PMMA as discussed above. Again the thickness of the protruding ferroelectric polymer thin film can be in the range from 5 nm to 5 $\mu$m as discussed above. Also the source and drain electrodes can be made from a variety of conducting materials as discussed above. On the surface of the thin dielectric layer 50 is a floating gate electrode 52. This floating gate electrode 52 can be made from a variety of conducting materials as discussed above. A protruding structure of ferroelectric polymer thin film 14 such as P(VDF-TrFE) is constructed on the floating gate electrode 52. The gate electrode 12 is constructed on the surface of the protruding ferroelectric polymer film layer 14. The gate electrode 12 may be constructed of a variety of conducting materials as discussed above.

Figure 12:
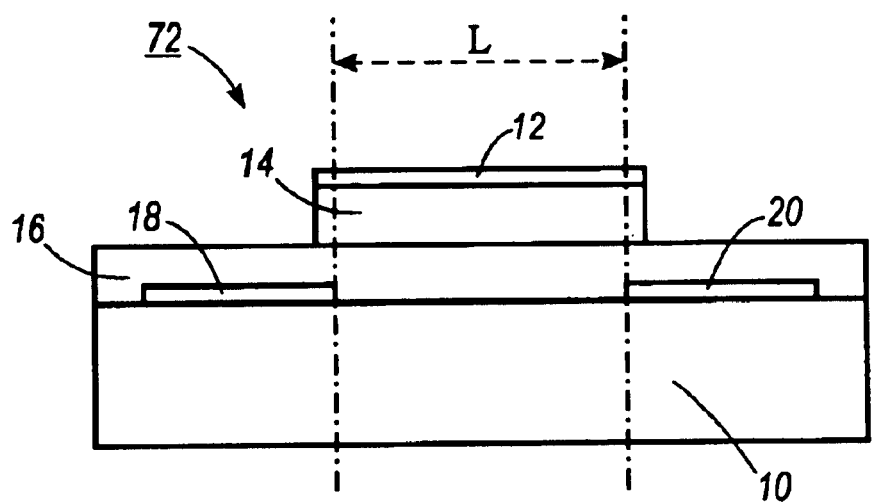
FIG. 12 is a cross section showing a twelfth embodiment of the present invention.

FIG. 12 shows a twelfth embodiment of a memory cell 72 similar the forgoing embodiments. Therefore the same reference numerals will be used to reference similar elements. The memory cell 72 is again constructed on a substrate 10 that can be comprised of a variety of materials such as including silicon, metal, glass and plastic as discussed above. However, in this embodiment the source electrode 18 and drain electrode 20 are on an upper surface of the substrate 10. As in the earlier embodiments when the gate electrode was provided on the surface of the substrate 10, if a conducting or semiconducting material is used for the substrate, the substrate should include an insulating layer on the upper surface. The source and drain electrodes can be made from a variety of conducting materials such as gold, platinum, aluminum, titanium, conducting oxides such as ITO, or conducting polymers such as polyaniline, and polypyrrol or any other conducting material.

On the top surface of source and drain electrodes and the remaining portion of the substrate is a layer of organic semiconductor 16 such as poly(phenylenes), thiophene oligomers, pentacene, polythiophene, and perfluoro copper phthalocyanine as discussed above. A protruding structure of ferroelectric polymer thin film 14 such as P(VDF-TrFE) is then constructed on the organic semiconductor 16 layer. The thickness of the protruding ferroelectric polymer thin film can be in the range of 5 nm to 5 $\mu$m, as discussed above. The gate electrode 12 is constructed on the surface of the protruding ferroelectric polymer film layer 14. The gate electrode 12 may be constructed of a variety of conducting materials as discussed above.

Figure 13:
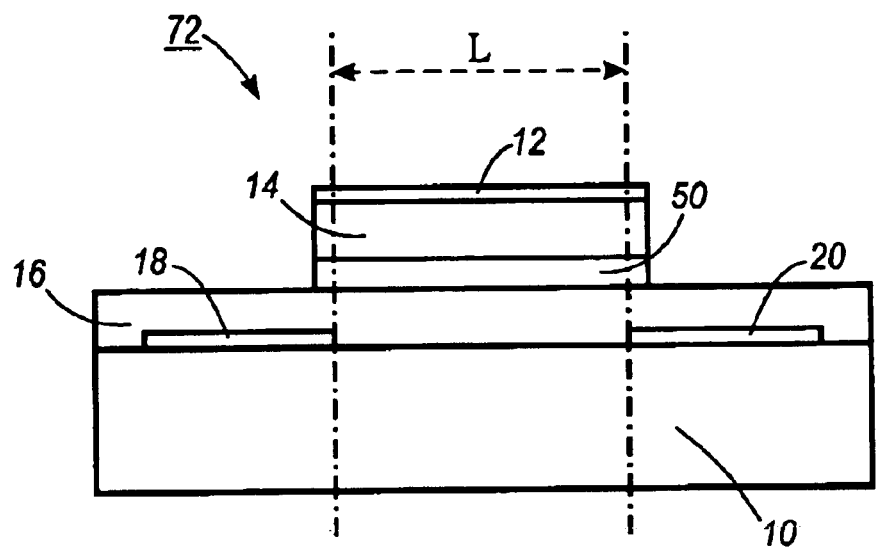
FIG. 13 is a cross section showing a thirteenth embodiment of the present invention.

FIG. 13 shows an thirteenth embodiment of a memory cell 74 similar to the forgoing embodiments, therefore the same reference numerals will be used to reference similar elements. The memory cell 74 is again constructed on a substrate 10 that can be comprised of a variety of materials such as including silicon, metal, glass and plastic as discussed above. On the surface of the substrate 10 are source electrode 18 and drain electrode 20 which can be made from a variety of conducting materials such as gold, platinum, aluminum, titanium, conducting oxides such as ITO, or conducting polymers such as polyaniline, and polypyrrol or any other conducting material, and a layer of organic semiconductor 16 such as poly(phenylenes), thiophene oligomers, pentacene, polythiophene, and perfluoro copper phthalocyanine as discussed above. A thin dielectric layer 50 is on the surface of the organic semiconductor thin film 16. The thin dielectric layer 50 can be made from a variety of materials including polyimide, PVA, PVC, or PMMA as discussed above. Above the thin dielectric layer 50 is the ferroelectric polymer thin film and again the thickness of the protruding ferroelectric polymer thin film 14 can be in the range of 5 nm to 5 µm. The gate electrode 12 is constructed on the surface of the protruding ferroelectric polymer film layer 14. The gate electrode 12 may be constructed of a variety of conducting materials as discussed above.

Figure 14:
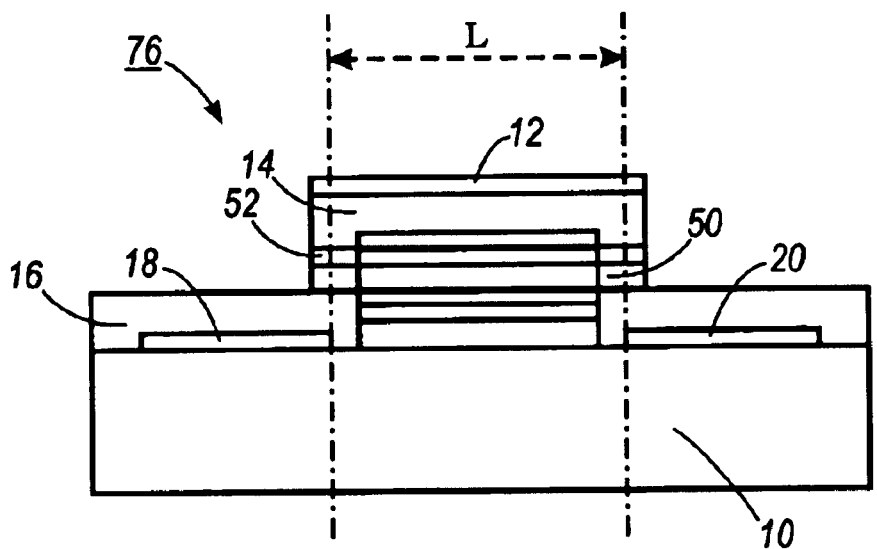
FIG. 14 is a cross section showing a fourteenth embodiment of the present invention.

FIG. 14 shows a fourteenth embodiment of a memory cell 76 similar to the foregoing embodiments and therefore the same reference numerals will be used to reference similar elements. The memory cell 76 is again constructed on a substrate 10 which can be comprised of a variety of materials such as including silicon, metal, glass and plastic as discussed above. On the surface of the substrate 10 are source electrode 18 and drain electrode 20 which can be made from a variety of conducting materials such as gold, platinum, aluminum, titanium, conducting oxides such as ITO, or conducting polymers such as polyaniline, and polypyrrol or any other conducting material, and a layer of organic semiconductor 16 such as poly(phenylenes), thiophene oligomers, pentacene, polythiophene, and perfluoro copper phthalocyanine as discussed above. A thin dielectric layer 50 is on the surface of the organic semiconductor thin film 16. The thin dielectric layer 50 can be made from a variety of materials including polyimide, PVA, PVC, or PMMA as discussed above. On the surface of the thin dielectric layer 50 is a floating gate electrode 52. This floating gate electrode 52 can be made from a variety of conducting materials as discussed above. A protruding structure of ferroelectric polymer thin film 14 such as P(VDF-TrFE) is constructed on the floating gate electrode 52. The gate electrode 12 is constructed on the surface of the protruding ferroelectric polymer film layer 14. The gate electrode 12 may be constructed of a variety of conducting materials as discussed above.

Figure 15:
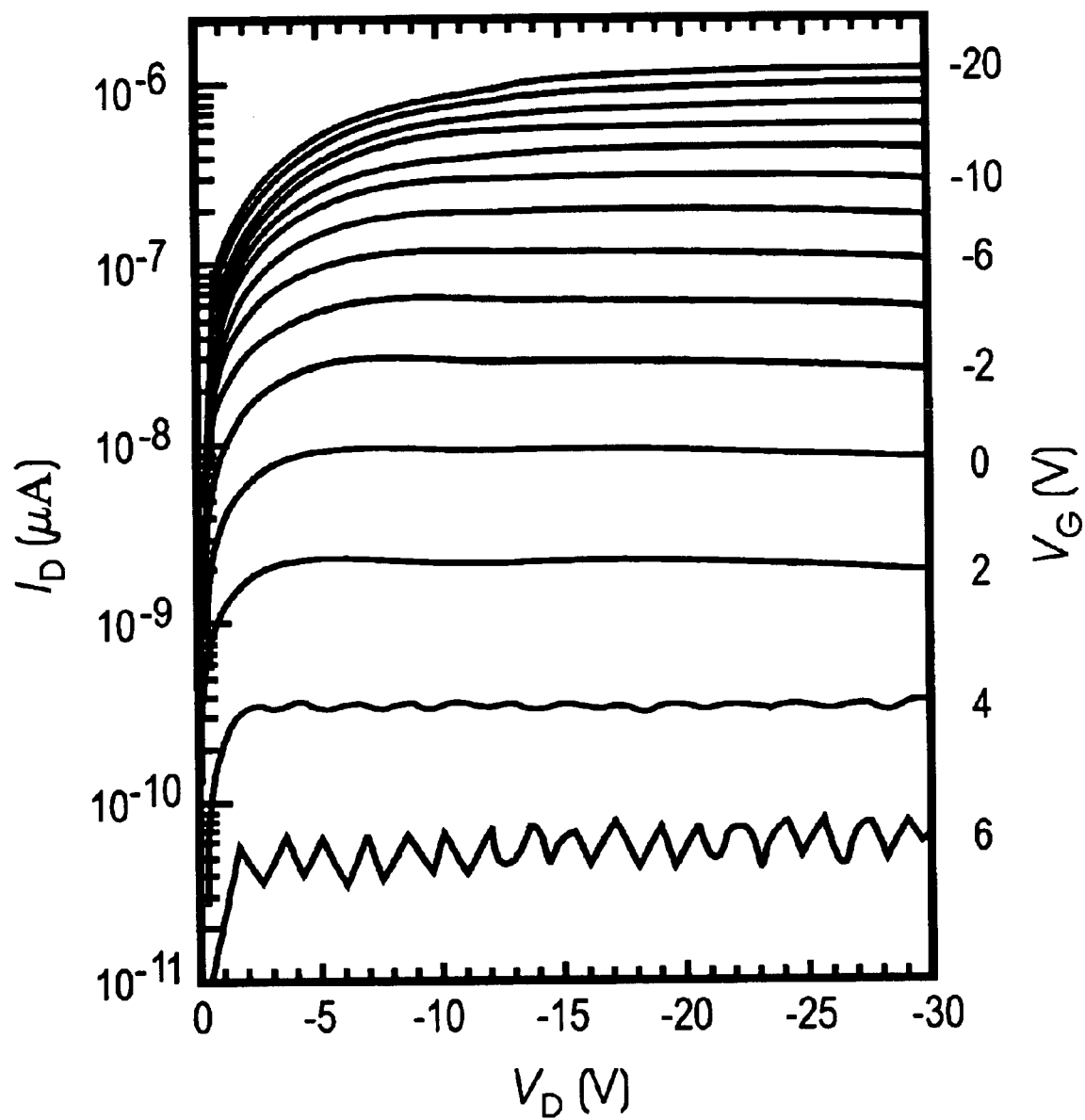
FIG. 15 is the source-drain current characteristics of a DH6T-based thin film FET.

The above described ferroelectric memory cells operate in the following manner. The source-drain current of an organic thin film FET depends on both the voltage applied on the drain electrode and the voltage applied on the gate electrode as shown in FIG. 15. That is, the source-drain current or resistance will be different under different gate voltages, even though the applied drain voltage is the same. This is illustrated in FIG. 10 which shows the source-drain current characteristics of a DH6T thin film FET using parylene-C as gate dielectric as discussed by C. D. Dimitrakopoulos, B. K. Furman, T. Graham, S. Hegde, and S. Purushothaman, in Synth. Met., Vol. 92, 47 (1998). For this organic FET, when a negative gate voltage is applied, the transistor is in an "on" state. That is, when a negative drain voltage is applied, a substantial current can flow between the source electrode and the drain electrode. For a gate voltage of −10V, the saturation current going through the source-drain will be larger than $10^{-7}$ µA. However, the transistor will be in an "off" state when a positive gate voltage is applied. That is, when a positive gate voltage is applied, the current between the source electrode and the drain electrode will be very small. For a gate voltage of 6V, the saturation current going through the source-drain will be smaller than $10^{-10}$ µA.

Figure 16:
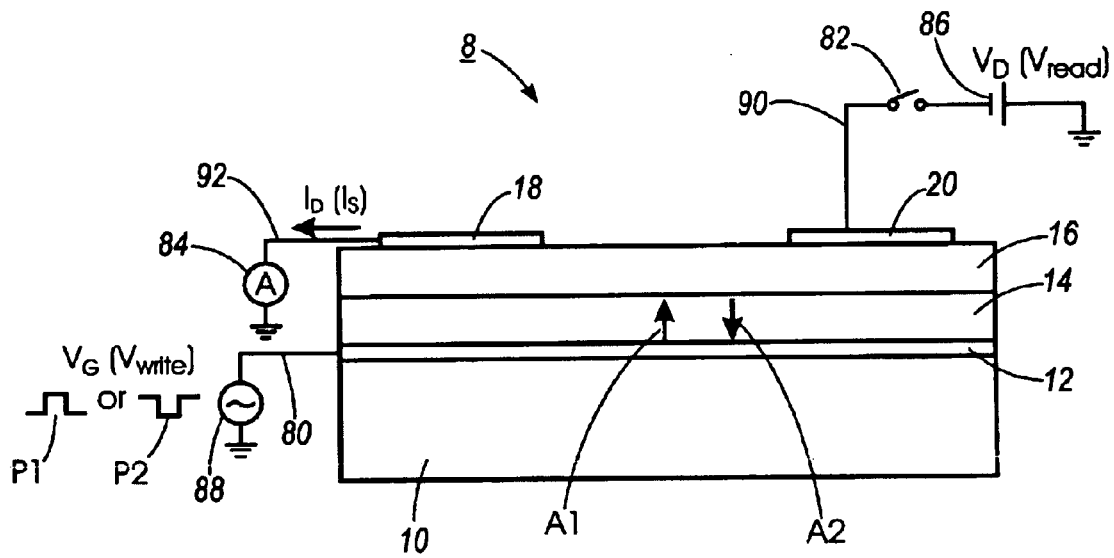
FIG. 16 shows the working mechanism of the organic memory cell, using the embodiment shown in FIG. 1.

FIG. 16 illustrates an exemplary embodiment of the memory cell 8 shown in FIG. 1 with a schematic representation of additional circuit elements used to address and operate the memory cell 8. The use of the embodiment shown in FIG. 1 is illustrative only and the operating principles apply to the other described embodiments as well. These additional elements include a gate line 80, a source line 92 and a drain line 90 for making connections to the gate electrode 12, source electrode 18 and the drain electrode 20 respectively. The switch 82 and power source 86 are used to apply a voltage to the drain (read voltage) to read the cell.

The power source 88, which can apply either a positive pulse P1 or a negative pulse P2, are used to apply the gate voltages (write voltage) to write either a binary "0" or "1" state to the cell. The current sensitive meter 84, which could be implemented as a sense amplifier with a reference cell as is known in the art, is used to detect the source-drain current under an applied drain voltage.

To write the cell a positive pulse P1 or negative pulse P2 will be applied from power source 88 on the gate electrode 12 via gate line 80. The positive pulse P1 or the negative pulse P2 will either positively polarize or negatively polarize the ferroelectric polymer thin film 14 as represented by arrows A1 and A2 respectively. In order to do this, the amplitude of the pulse voltage P1 or P2 should be larger than the coercive voltage of the ferroelectric polymer thin film.

Figure 17:
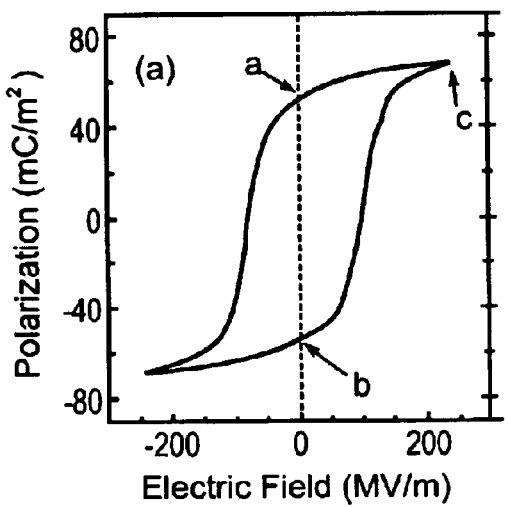
FIG. 17 shows the polarization-electrode field hysteresis loop of ferroelectric polymer thin films.

Due to polarization-electric field hysteresis or the existence of remnant polarization of the ferroelectric polymer thin film 14, as shown in FIG. 17, there will exist a positive polarization or negative polarization in the ferroelectric polymer thin film 14 after the removal of the pulse or voltage applied to the gate electrode 12. This can be seen by looking at points a and b where point a shows a remnant polarization of approximately 60 mC/m$^2$ and point b shows a remnant polarization of approximately −60 mC/m$^2$. The remnant polarization in the ferroelectric polymer thin film 14 is equivalent to putting either a positive or negative bias on the gate electrode, depending on the polarization state.

To read the cell the source-drain current will be measured under a drain voltage $V_D$ applied to the drain electrode 20 from power source 86 through line 90 with switch 82 is closed. This drain voltage $V_D$, or read voltage $V_{read}$, does not need to be the same the write voltage, but should be large enough to make the source-drain current saturated. Due to the bias effect from the remnant polarization of the ferroelectric polymer thin film 14, the source-drain current measured will be quite different for a given drain voltage. The differences will depend on the polarization direction of the ferroelectric polymer thin film 14. These different measured source-drain currents under the same drain voltage then indicate the different polarization states of the ferroelectric polymer thin film 14. The different measured source-drain currents or the different polarization states are then used to represent either a "0" or "1" state. Therefore applying a positive or negative voltage or pulse on the gate electrode can be used to change the polarization direction of the ferroelectric polymer thin film 14 and to write a binary "0" or "1" to the memory cell 8. Applying a voltage on the drain electrode 20 and measuring the source-drain current can then be used to read the data from the memory cell 8. This provides an organic FET memory cell 8 which is easy to read and write, is nonvolatile, and has a nondestructive readout.

Figure 18:
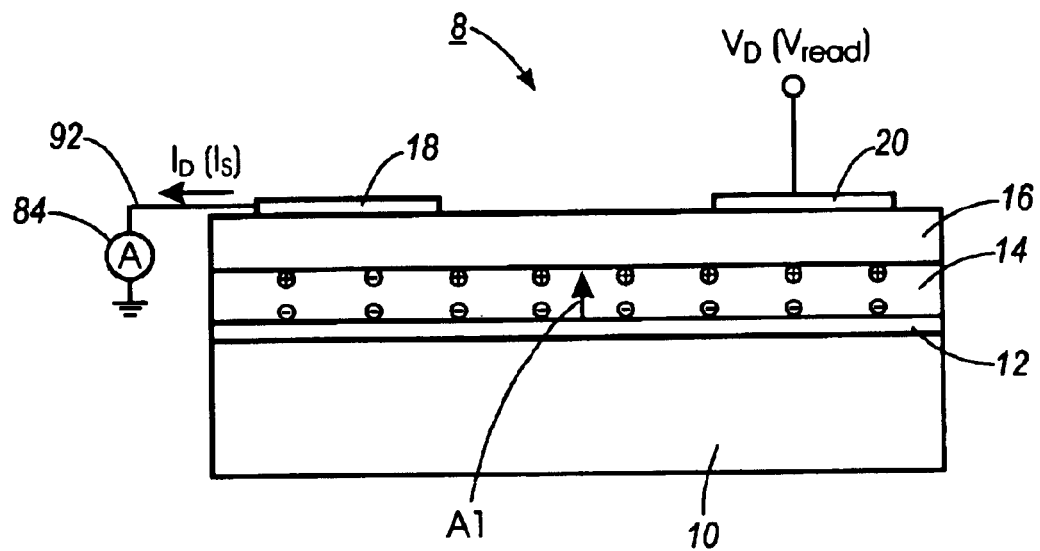
FIG. 18 illustrates the state of polarization of the ferroelectric polymer thin film for an arbitrarily selected binary "0" state.
Figure 19:
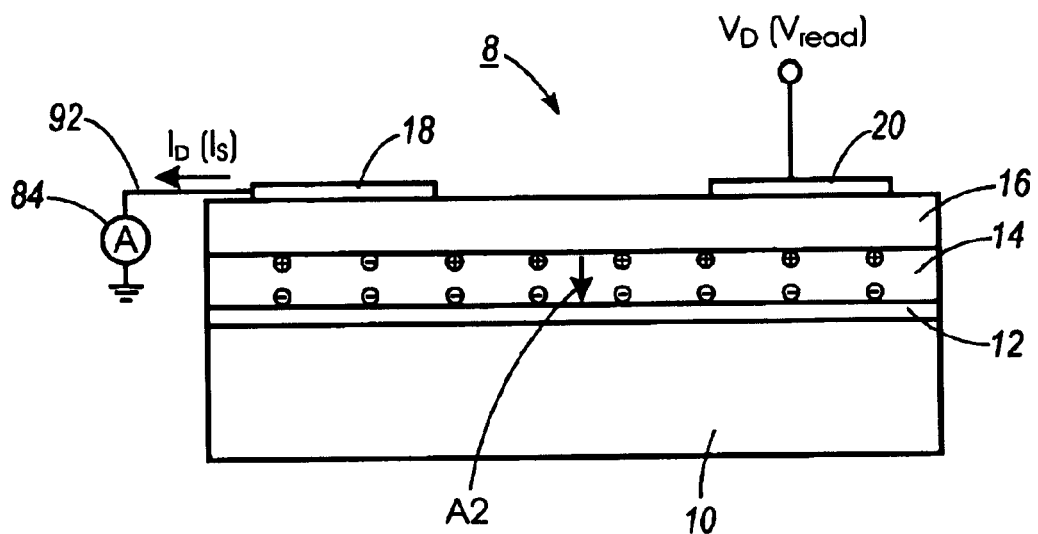
FIG. 19 illustrates the state of polarization of the ferroelectric polymer thin film for a binary "1" state.

FIGS. 18 and 19 further illustrate the polarization states of the ferroelectric polymer thin film and their effect on the gate area. These two figures include negative charges n and positive charges p.

FIG. 18 illustrates the polarization state of the ferroelectric polymer thin film 14 after a positive pulse P1 has been applied to the gate electrode 12 to write a "0" to the cell. After a positive gate voltage is applied, the remnant polarization in the ferroelectric polymer thin film will point "up" as shown by arrow A1, and thus positive charges p will accumulated at the interface between the ferroelectric polymer thin film 14 and organic semiconductor thin film 16. This is equivalent to a positive bias applied on the gate electrode. If we assume the semiconductor thin film is DH6T and it has the same behavior as shown in FIG. 15, then under current condition the transistor is in "off" state and the source-drain current will be very small under a drain voltage, therefore we have a "0" state.

FIG. 19 illustrates the polarization state of the ferroelectric polymer thin film 14 after a negative pulse P2 is applied to the gate electrode 12 to write a "1" to the cell. After a negative gate voltage is applied, the remnant polarization in the ferroelectric polymer thin film 14 will point "down" as shown by arrow A2, and thus negative charges will accumulated at the interface between the ferroelectric polymer thin film 14 and organic semiconductor thin film 16. This is equivalent to a negative bias applied to the gate electrode. If again we assume the semiconductor thin film is DH6T and it has the same behavior as shown in FIG. 15, then under this condition the transistor is in "on" state and a substantial source-drain current will be generated under a drain voltage. Therefore, we have a "1" state.

What is claimed is:

1. A memory cell comprising:
    a) an organic semiconductor having two opposed surfaces;
    b) two spaced apart electrodes in contact with one surface of the organic semiconductor, wherein the distance therebetween is a channel length and the portion of the organic semiconductor therebetween is defined as a channel region;
    c) a ferroelectric polymer having a dielectric constant and two opposed surfaces wherein one surface is in contact with one surface of the organic semiconductor for at least a portion of the channel region;
    d) a gate electrode in contact with one surface of the ferroelectric polymer for at least a portion of the channel region; and
    e) an organic dielectric interposed between the ferroelectric polymer and the organic semiconductor.

2. The memory cell of claim 1 further comprising a substrate so constructed and arranged to provide support for the memory cell.

3. The memory cell of claim 2 wherein the substrate is at least partially adjacent to the gate electrode.

4. The memory cell of claim 2 wherein the substrate is at least partially adjacent to the organic semiconductor.

5. The memory cell of claim 2 wherein the substrate comprises a flexible substrate.

6. The memory cell of claim 2 wherein the substrate comprises a rigid substrate.

7. The memory cell of claim 2 wherein the substrate is at least partially conductive.

8. The memory cell of claim 7 wherein the substrate further comprises an insulative portion on a surface of the substrate.

9. The memory cell of claim 7 wherein the substrate comprises a metal.

10. The memory cell of claim 7 wherein the substrate comprises a semiconductor.

11. The memory cell of claim 2 wherein the substrate comprises a plastic.

12. The memory cell of claim 1 wherein the organic semiconductor has a thickness of at least 5 nm.

13. The memory cell of claim 12 wherein the organic semiconductor has a thickness of at least 50 nm.

14. The memory cell of claim 12 wherein the organic semiconductor has a thickness of approximately 100 nm.

15. The memory cell of claim 1 wherein the organic semiconductor has a field-effect mobility of at least $10^{-3}$ cm$^2$V$^{-1}$s$^{-1}$.

16. The memory coil of claim 1 wherein the organic semiconductor has a field-effect mobility of at least $10^{-3}$ cm$^2$V$^{-1}$s$^{-1}$.

17. The memory cell of claim 1 wherein the ferroelectric polymer has a thickness of at least 8 nm.

18. The memory cell of claim 17 wherein the ferroelectric polymer has a thickness of at least 50 nm.

19. The memory cell of claim 17 wherein the ferroelectric polymer has a thickness of approximately 100 nm.

20. The memory cell of claim 1 wherein the ferroelectric polymer has a remnant polarization of at least 0.1 $\mu$C/cm$^2$.

21. The memory cell of claim 1 wherein the ferroelectric polymer has a remnant polarization of at least 0.5 $\mu$C/cm$^2$.

22. The memory cell of claim 1 wherein the gate electrode comprises a conductive material.

23. The memory cell of claim 22 wherein the gate electrode comprises a metal.

24. The memory cell of claim 22 wherein the gate electrode comprises a conductive oxide.

25. The memory cell of claim 22 wherein the gate electrode comprises a conductive polymer.

26. The memory cell of claim 1 wherein the two spaced apart electrodes comprise a conductive material.

27. The memory cell of claim 26 wherein the two spaced apart electrodes comprise a metal.

28. The memory cell of claim 26 wherein the two spaced apart electrodes comprise a conductive oxide.

29. The memory cell of claim 26 wherein the two spaced apart electrodes comprise a conductive polymer.

30. The memory cell of claim 1 wherein the organic dielectric has a dielectric constant at least the same as the dielectric constant of the ferroelectric polymer.

31. The memory cell of claim 1 wherein the memory cell further comprises a floating, gate electrode interposed between the ferroelectric polymer and the organic dielectric.

32. The memory cell of claim 31 wherein the floating gate electrode comprises a conductive material.

33. The memory cell of claim 32 wherein the floating gate electrode comprises a metal.

34. The memory cell of claim 32 wherein the floating gate electrode comprises a conductive oxide.

35. The memory cell of claim 32 wherein the floating gate electrode comprises a conductive polymer.

36. A memory cell comprising:
    a) a substrate having a surface;
    b) an organic semiconductor having first and second surfaces wherein the first surface is adjacent to the surface of the substrate;
    c) two spaced apart electrodes in contact with one surface of the organic semiconductor, wherein the distance there between is a channel length and the portion of the organic semiconductor therebetween is defined as a channel region;
    d) an organic dielectric having first and second surfaces wherein the first surface is in contact with the second surface of the organic semiconductor;
    e) a ferroelectric polymer having a dielectric constant and two opposed surfaces wherein one surface is in contact with second surface of the organic dielectric for at least a portion of the channel region; and
    f) a gate electrode in contact with one surface of the ferroelectric polymer for at least a portion of the channel region.

37. The memory cell of claim 30 wherein the organic dielectric is CYEPL.

38. The memory cell of claim 30 wherein the organic dielectric is α-phase PVDF.

39. The memory cell of claim 30 wherein the organic dielectric is PVA.

* * * * *